United States Patent
Tsao et al.

(10) Patent No.: US 7,234,738 B2
(45) Date of Patent: Jun. 26, 2007

(54) FASTENING DEVICE FOR USE IN A CASING ASSEMBLY

(75) Inventors: Johnson Tsao, Taipei (TW); Hsin-Chih Liu, Taipei (TW); Wang-Hai Chang, Taipei (TW)

(73) Assignee: Inventec Applicances Corp., Taipei (TW)

( * ) Notice: Subject to any disclaimer, the term of this patent is extended or adjusted under 35 U.S.C. 154(b) by 124 days.

(21) Appl. No.: 11/201,324

(22) Filed: Aug. 11, 2005

(65) Prior Publication Data

US 2007/0037451 A1    Feb. 15, 2007

(51) Int. Cl.
*H01M 2/10*    (2006.01)
(52) U.S. Cl. ............... 292/242; 220/326; 292/DIG. 11
(58) Field of Classification Search ............... 439/500; 429/97, 100; 292/240–242, 202, 212, 210, 292/304, DIG. 11; 220/326
See application file for complete search history.

(56) References Cited

U.S. PATENT DOCUMENTS

| | | | | |
|---|---|---|---|---|
| 1,487,478 A | * | 3/1924 | Rubin | 292/242 |
| 3,441,128 A | * | 4/1969 | Goldberg | 206/403 |
| 4,813,726 A | * | 3/1989 | Ravinet | 292/241 |
| 5,067,278 A | * | 11/1991 | Lyons | 49/463 |
| 6,261,715 B1 | * | 7/2001 | Nakamura et al. | 429/100 |
| 6,371,535 B2 | * | 4/2002 | Wei et al. | 292/175 |
| 6,394,300 B1 | * | 5/2002 | Bosy | 220/326 |
| 6,660,427 B1 | * | 12/2003 | Hukill et al. | 429/97 |
| 2006/0141344 A1 | * | 6/2006 | Chen et al. | 429/97 |

* cited by examiner

*Primary Examiner*—Neil Abrams
(74) *Attorney, Agent, or Firm*—Troxell Law Office, PLLC

(57) ABSTRACT

A casing assembly includes a casing having a receiving space and an entrance, and a lid mounted detachably in the entrance to deny access into the space. A fastening device is disposed in the casing, and includes a blocking plate and a resilient clip urging the blocking plate to rotate in a predetermined direction to engage the same with the lid, thereby preventing removal of the lid from the casing. The lid may include a downwardly extending tongue which passes through a hole in the casing and is to be engaged by a hook-like portion on the end of the blocking plate.

7 Claims, 4 Drawing Sheets

FASTENING DEVICE FOR USE IN A CASING ASSEMBLY

FIELD OF THE INVENTION

The invention relates to a casing assembly, more particularly to a fastening device for use in the casing assembly. The fastening device fastens a lid onto a casing to deny access into the casing.

BACKGROUND OF THE INVENTION

A conventional casing assembly generally includes a casing that defining a receiving space and that is formed with an entrance for access into the receiving space, and a lid fastened detachably on the casing via a fastening device to cover the entrance so as to deny access into the receiving space.

Referring to FIGS. 1 and 2, a conventional casing assembly 1 (such as a notebook computer) includes a casing 2 (an outer casing of the notebook computer), a lid 3 and a fastening device 10. The casing 2 defines a receiving space 2" (a battery-receiving chamber), is formed with an entrance 4" for access into the receiving space 2". The lid 3 has two engaging tongues 5, and is disposed on the casing 2 to cover the entrance 4" in such a manner that the engaging tongues 5 extends into the receiving space 2" via two through hole 4 in the casing 2. The fastening device 10 is mounted within the casing 2, and includes two locking bars 6 (only one is shown in FIG. 2), two stationary seats 9 (only one is shown in FIG. 2) fixed on the casing 2 adjacent to two opposite sides of the entrance 4, and two urging members 8 (only one is shown in FIG. 2) disposed between an adjacent pair of the locking bar 6 and the stationary seat 9 for urging the respective locking bar 6 to abut against the respective engaging tongue 5 of the lid 3, thereby fastening the lid 3 detachably on the casing 2.

Each of the locking bars 6 and the tongues 5 is provided with an inclined surface 6" to facilitate insertion of the respective tongue 5 into the receiving space 2" via the respective through hole 4 during insertion of the lid 3 into the entrance 4" or removal of the lid 3 from the entrance 4". It is relatively difficult for the user to remove the lid 3 from the casing 2 when he wishes to replace the battery (not shown), since the lid 3 is generally flush with the outer surface of the casing 2. The user must use his fingernails to poke out the lid 3 from the entrance 4" in the casing 2, thereby inconveniencing the user.

SUMMARY OF THE INVENTION

The object of the present invention is to provide a fastening device for use in a casing assembly. The fastening device has a simple construction and is easy to operate in order to eliminate the difficulty encountered during use of the conventional casing assembly.

A casing assembly according to the present invention includes: a casing defining a receiving space, and having inner and outer surfaces, a retention hole formed through the inner and outer surfaces, and an entrance for access into the receiving space in the casing; a lid mounted within the entrance in the casing to deny access into the receiving space; and a fastening device. The fastening device includes: two positioning plates mounted stationarily on the inner surface of the casing in such a manner that the positioning plates extend radially from the retention hole to define an angle therebetween; a rotary member enclosed within the casing and extending into the retention hole in the casing, the rotary member having an inner end, an outer operating end exposed from the outer surface of the casing, a blocking plate radially extending from the inner end, and a restricting plate extending radially from the inner end into the angle between the positioning plates; and a resilient clip disposed within the casing, and having a looped portion, a coupling strip extending from one side of the looped portion and fastened securely to the casing, and an urging strip extending from the other side of the looped portion for urging the restricting plate to rotate in a first direction so as to press against one of the positioning plates, which, in turn, rotates the blocking plate toward the entrance to abut against the lid, thereby preventing removal of the lid from casing. Rotation of the outer operating end of the rotary member in a second direction opposite to the first direction against urging action of the resilient clip results in rotation of the restricting plate in the second direction so as to press against the other one the positioning plates, thereby permitting removal of the lid from the casing.

BRIEF DESCRIPTION OF THE DRAWINGS

Other features and advantages of this invention will become more apparent in the following detailed description of the preferred embodiment of this invention, with reference to the accompanying drawings, in which.

DETAILED DESCRIPTIONS OF THE PREFERRED EMBODIMENT

Figure 1:
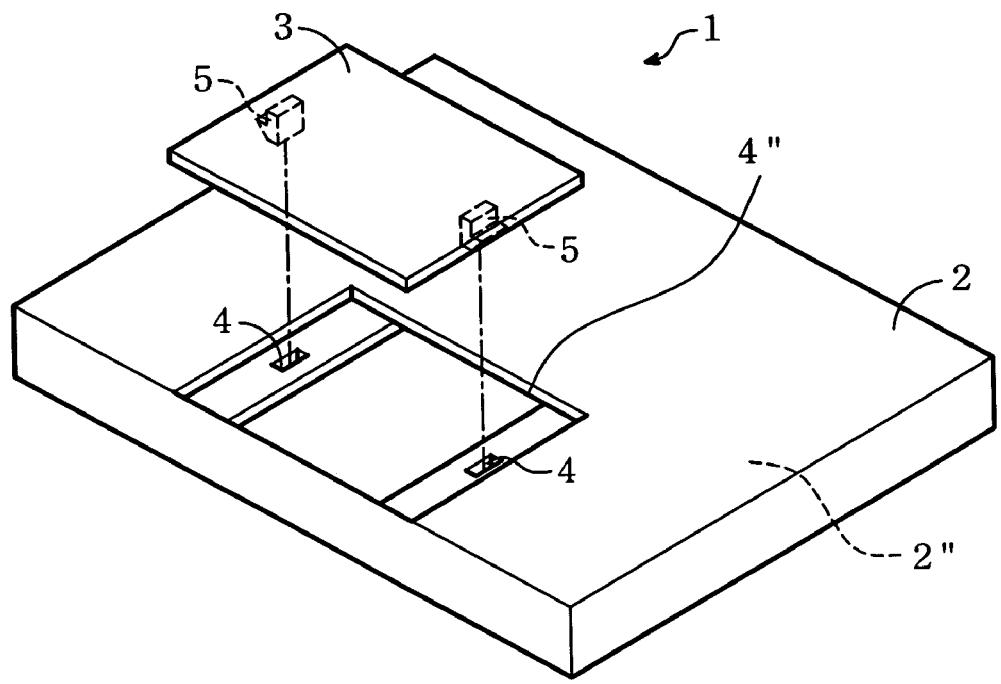
FIG. 1 is a perspective view of a conventional casing assembly.
Figure 2:
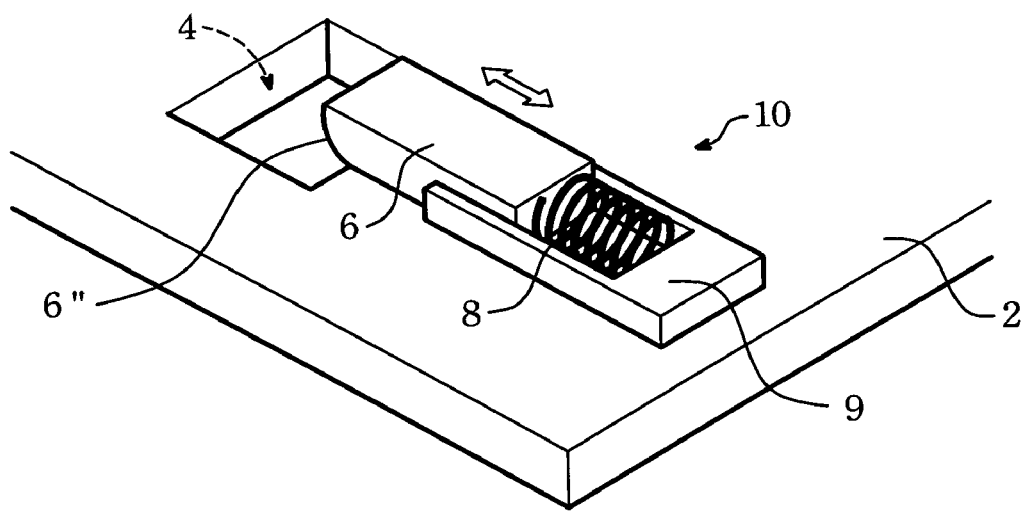
FIG. 2 shows a fastening device, illustrating how a lid is fastened onto a casing of the conventional casing assembly.
Figure 3:
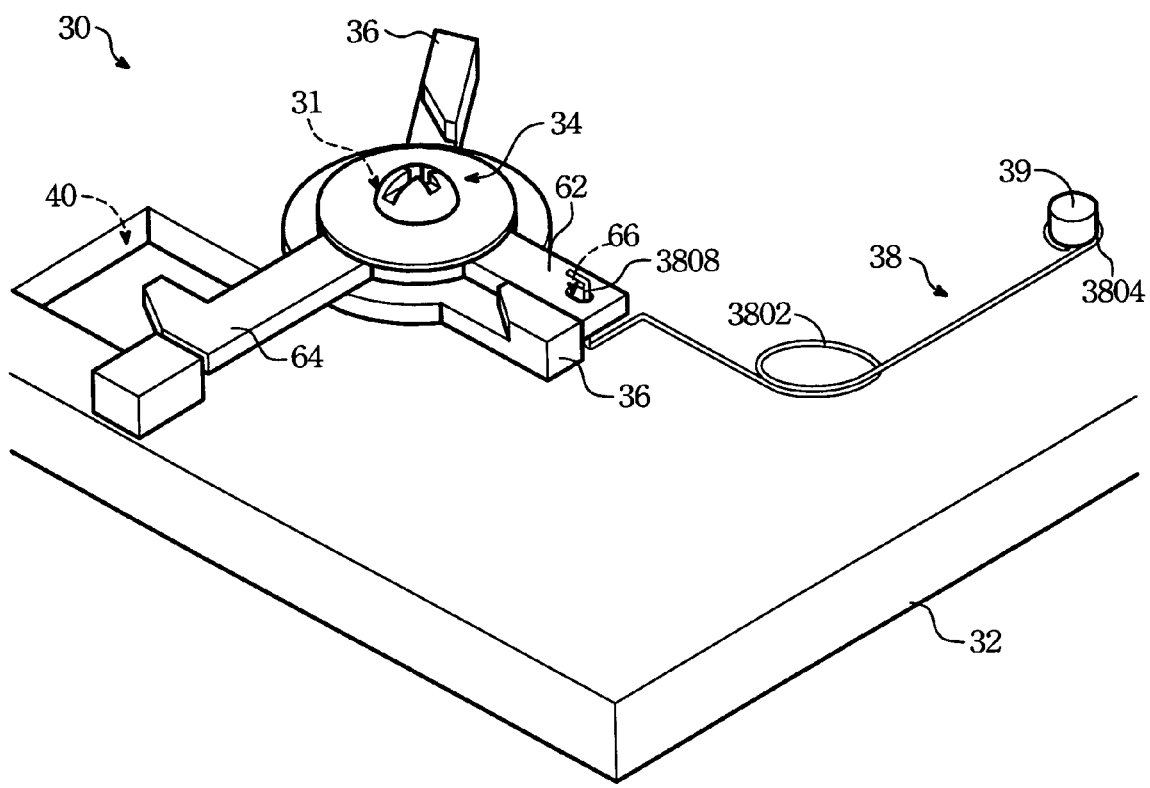
FIG. 3 shows a fragmentary partly exploded view of the casing assembly according to the present invention.
Figure 4:
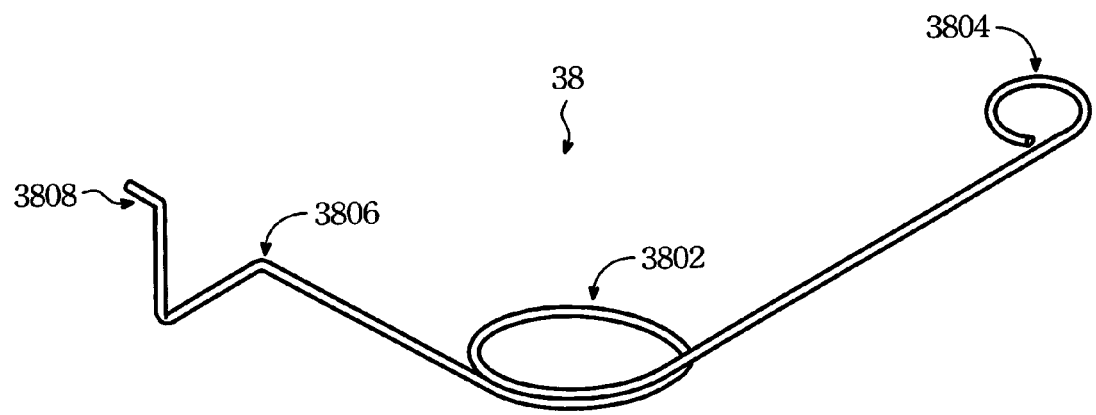
FIG. 4 is a perspective enlarged view of a resilient clip of a fastening device employed within the casing assembly of the present invention.

Referring to FIGS. 3 and 4, the casing assembly according to the present invention is shown to include a casing 32 (such as an outer casing of a notebook computer), a lid 3 (see FIG. 1) and two fastening devices 30 (only one is shown in FIG. 3).

As illustrated, the casing 32 defines a receiving space 32" (such as a battery-receiving chamber), and has inner and outer surfaces, two retention hole 31 (only one is shown in FIG. 3) formed through the inner and outer surfaces, and an entrance 41 (see FIG. 7) for access into the receiving space 32".

The lid 3 (see FIG. 1) is mounted within the entrance 41 in the casing 32 to deny access into the receiving space 32".

Each fastening device 30 includes two positioning plates 36, a rotary member 34, and a resilient clip 38. The positioning plates 36 are mounted stationarily on the inner surface of the casing 32 in such a manner that the positioning plates 36 extend radially from the respective retention hole 31 to define an angle therebetween. The rotary member 34 is enclosed within the casing 32, and extends into the respective retention hole 31 in the casing 32. The rotary member 34 has an inner end 42, an outer operating end 41 exposed from the outer surface of the casing 32, a blocking plate 64 extending radially from the inner end 42, and a restricting plate 62 extending radially from the inner end 42 into the angle between the positioning plates 36. The resilient clip 38 is disposed within the casing 32, and has a looped portion 3802, a coupling strip 3804 extending from one side of the looped portion 3802 and fastened securely to the casing 32, and an urging strip 3806 extending from the other side of the looped portion 3802 for urging the restricting plate 62 to rotate in a first direction (the clockwise direction) so as to press against one of the positioning plates 36, which, in turn, rotates the blocking plate 64 toward the entrance 40 to abut against the lid 3 (not shown), thereby preventing removal of the lid 2 from casing 32. Rotation of the outer operating end 41 of the rotary member 34 in a second direction (the counter clockwise direction) opposite to the first direction against urging action of the resilient clip 38 results in rotation of the restricting plate 62 in the second direction so as to press against the other one the positioning plates 36 (not shown), thereby permitting removal of the lid 3 from the casing 32.

Referring again to FIGS. 3 and 4, the inner surface of the casing 32 is formed with a clip-retention post 39. The coupling strip 3804 (being a loop) of the resilient clip 38 is sleeved securely on the clip-retention post 39. Each restricting plate 62 is formed with a coupling hole 66. The resilient clip 38 further has an L-shaped hook portion 3808 extending from the urging strip 3806 into the coupling hole 66 in the restricting plate 62 for urging the same to rotate in the first direction.

Figure 5:
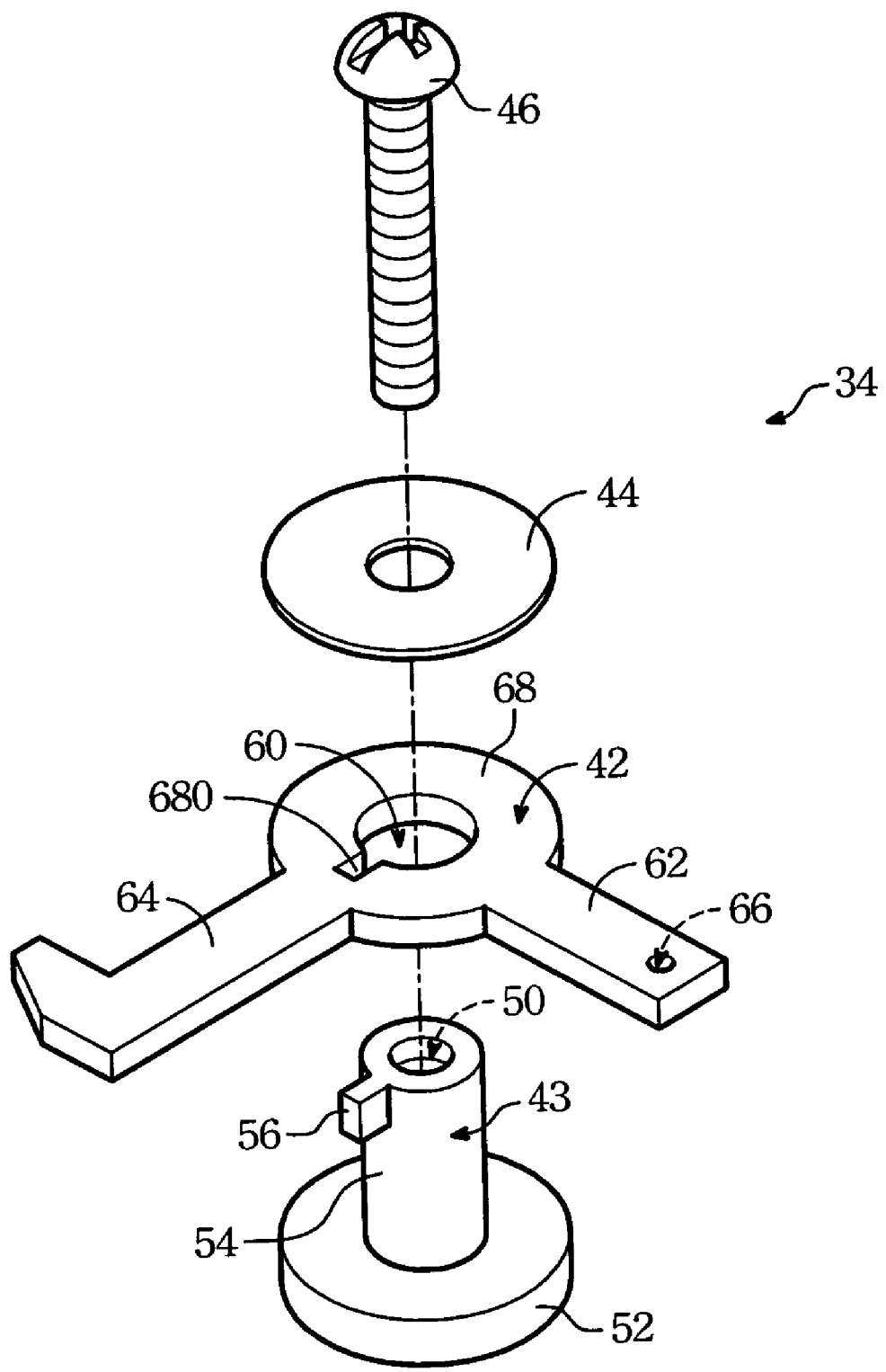
FIG. 5 is an exploded view of the fastening device employed within the casing assembly of the present invention.
Figure 6:
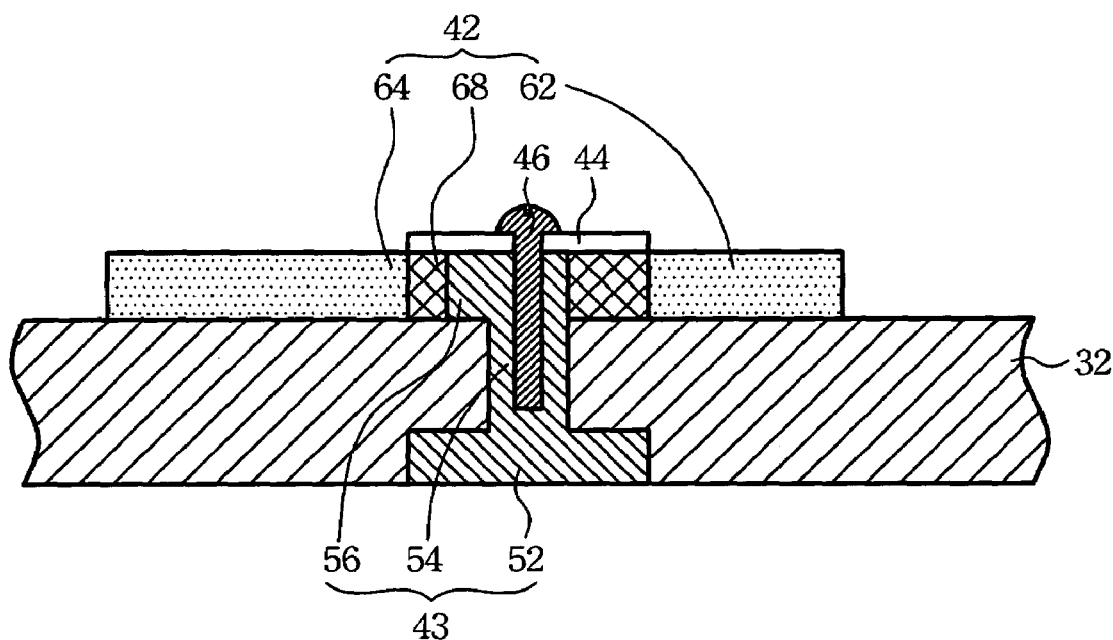
FIG. 6 is a fragmentary sectional view, illustrating how the fastening device is mounted within the casing assembly of the present invention.

Referring to FIG. 5, the fastening device 30 further includes a hollow cylinder 54, an annular connecting disc 68, an operating knob 52, a washer 44 and a fastener screw 46. The hollow cylinder 54 extends through the respective retention hole 31 in the casing 32, and has an inner end and an outer end. The annular connecting disc 68 is sleeved securely on the inner end of the cylinder 54, and interconnects the blocking plate 64 and the restricting plate 62 in such a manner to permit synchronous rotation therewith. Under this condition, the annular connecting disc 68 serves as the inner end 42 of the rotary member 34. The operating knob 52 is fixed to the outer end of the cylinder 54, is exposed from the outer surface of the casing 32 (see FIG. 7) and serves as the operating end 41 of the rotary member 34. The washer 44 is disposed on the annular connecting disc 68 while the fastener screw 46 extends through the washer 44, the annular connecting disc 68 to engage the cylinder 54, thereby preventing untimely removal of the respective fastening device 30 from the casing 32.

As illustrated in FIG. 5, the annular connecting disc 68 has an inner peripheral portion defining a through hole 60 to permit extension of the fastener screw 46, and an engaging recess 680 extending radially and outwardly from the inner peripheral portion. The cylinder 54 has an engaging tongue 56 extending radially and outwardly to engage the recess 680 in the annular connecting disc 68 to permit synchronous rotation of the annular connecting disc 68, the blocking plate 64 and the restricting plate 62 together with the cylinder 54. Preferably, the cylinder 54 has an inner threaded hole for engaging the fastener screw 46.

Figure 7:
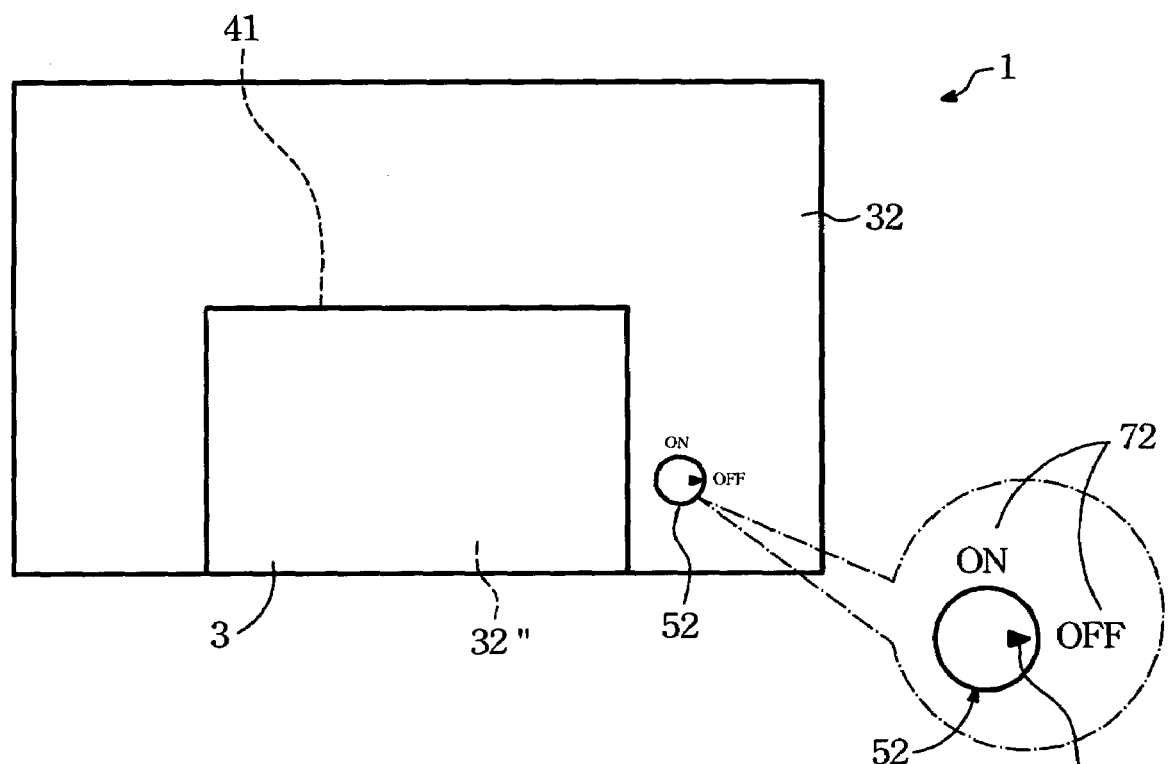
FIG. 7 is a rear view of the casing assembly of the present invention.

Referring to FIG. 7, the outer surface of the casing 32 is formed with two indicating marks 72 (such as close or open) each representing rotation direction of the operating knob 52 with respect to the casing 32 in order to fasten or unfasten the lid 3 with respect to the casing 32. The operating knob 52 is printed with an arrow 70 such that when the lid 3 is mounted on the casing 32, the arrow 70 is pointed to one of the indicating marks 72 (i.e. close). Under this condition, if the user wishes to remove the lid 3 from the casing 32, he is to turn the operating knob 52 toward the other one of the indicating marks 72 (turning the operating knob 52 in the counter clockwise direction).

To summarize the above paragraphs, it is observable that by virtue of the fastening device employed the casing assembly of the present invention, the user can easily fasten the lid 3 onto or unfasten the same from the casing by simply rotating the operating knob 52 in the clockwise and counter clockwise directions. The problem of poking the lid with the user's fingernails as encountered in the conventional casing assembly is eliminated.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A casing assembly comprising
   a casing defining a receiving space, having inner and outer surfaces, a retention hole formed through said inner and outer surfaces, and an entrance for access into said receiving space in said casing;
   a lid mounted within said entrance in said casing to deny access into said receiving space in said casing; and
   a fastening device including
      two positioning plates mounted stationarily on said inner surface of said casing in such a manner that said positioning plates extend radially from said retention hole to define an angle therebetween,
      a rotary member enclosed within said casing and extending into said retention hole in said casing, said rotary member having an inner end, an outer operating end exposed from said outer surface of said casing, a blocking plate extending radially from said inner end, and a restricting plate extending radially from the inner end into said angle between said positioning plates, and
      a resilient clip disposed within said casing, and having a looped portion, a coupling strip extending from one side of said looped portion and fastened securely to said casing, and an urging strip extending from the other side of said looped portion for urging said restricting plate to rotate in a first direction so as to press against one of said positioning plates, which, in turn, rotates said blocking plate toward said entrance to abut against said lid, thereby preventing removal of said lid from casing,
   whereby, rotation of said outer operating end of said rotary member in a second direction opposite to said first direction against urging action of said resilient clip results in rotation of said restricting plate in said second direction so as to press against the other one said positioning plates, thereby permitting removal of said lid from the casing.

2. The casing assembly according to claim 1, wherein said fastening device further includes a hollow cylinder extending through said retention hole in said casing, an annular connecting disc sleeved on an inner end of said cylinder and interconnecting said blocking plate and said restricting plate in such a manner to permit synchronous rotation therewith and defining said inner end of said rotary member, an operating knob fixed to an outer end of said cylinder and defining said operating end of said rotary member, a washer overlapping said annular connecting disc, and a fastener screw extending through said washer, said annular connecting disc to engage said cylinder, thereby preventing untimely removal of said fastening device from said casing.

3. The casing assembly according to claim 2, wherein said annular connecting disc has an inner peripheral portion defining a through hole to permit extension of said fastener screw, and an engaging recess extending radially and outwardly from said inner peripheral portion, said cylinder having an engaging tongue extending radially and outwardly therefrom to engage said recess in said annular connecting disc to permit synchronous rotation of said annular connecting disc, said blocking plate and said restricting plate together with said cylinder.

4. The casing assembly according to claim 3, wherein said cylinder has an inner threaded hole for engaging said fastener screw.

5. The casing assembly according to claim 1, wherein said restricting plate is formed with a coupling hole, said urging strip of said resilient clip extending into said coupling hole in said restricting plate and urging said restricting plate to rotate in said first direction.

6. The casing assembly according to claim 3, wherein said outer surface of said casing is formed with two indicating marks each representing rotation direction of said operating knob with respect to said casing in order to fasten or unfasten said lid with respect to said casing.

7. The casing assembly according to claim 1, wherein said inner surface of said casing is formed with a clip-retention post, said coupling strip of said resilient clip being fastened to said clip-retention post.

* * * * *